(12) United States Patent  
Corredoura

(10) Patent No.: US 7,225,093 B1  
(45) Date of Patent: May 29, 2007

(54) SYSTEM AND METHOD FOR GENERATING TRIGGERS BASED ON PREDETERMINED TRIGGER WAVEFORM AND A MEASUREMENT SIGNAL

(75) Inventor: Paul L. Corredoura, Redwood City, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/285,706

(22) Filed: Nov. 21, 2005

(51) Int. Cl.  
*G06F 19/00* (2006.01)

(52) U.S. Cl. .................................... 702/79; 324/76.11

(58) Field of Classification Search ............ 702/77–79, 702/76, 182–185; 324/76.11; 375/346  
See application file for complete search history.

(56) References Cited

U.S. PATENT DOCUMENTS 6,707,411 B1    3/2004  Poulton et al.
6,720,895 B2    4/2004  Poulton et al.
6,909,310 B2    6/2005  Poulton et al.
2003/0146861 A1 8/2003  Poulton et al.
2003/0161420 A1* 8/2003 Pupalaikis ................. 375/346

* cited by examiner

Primary Examiner—Edward Raymond

(57) ABSTRACT

A test measurement system and method which uses parallel digital samples of an input measurement signal to determine a trigger point for a predetermined trigger waveform. The system correlates the predetermined trigger waveform with digital samples of the input measurement signal. The result of this correlation is then used to identify a trigger point. Generally the point in time where the trigger waveform has the strongest correlation with the digital samples identifies the desired trigger point. This trigger point is then used to identify the selected measurement data, where the selected measurement data corresponds to the digital samples obtained at the trigger point time.

17 Claims, 7 Drawing Sheets

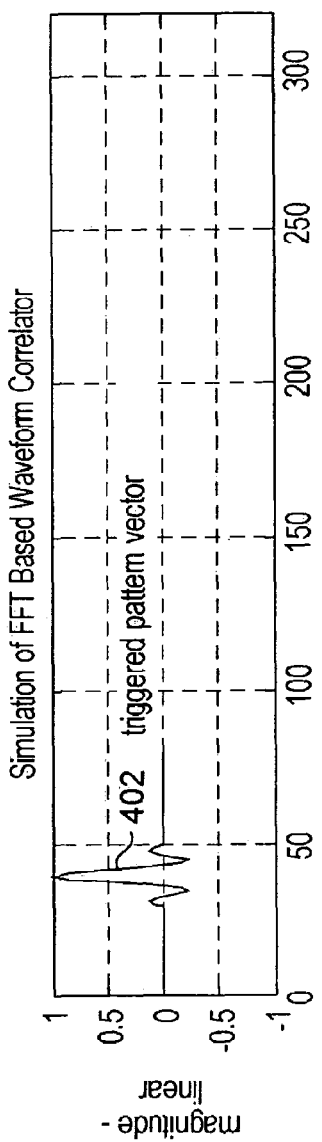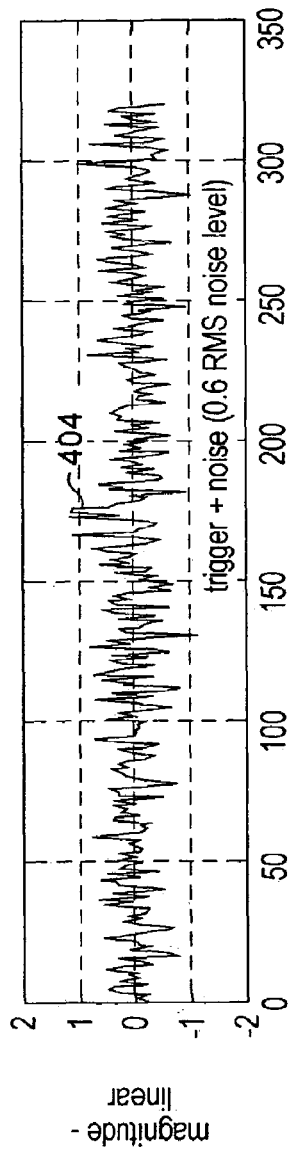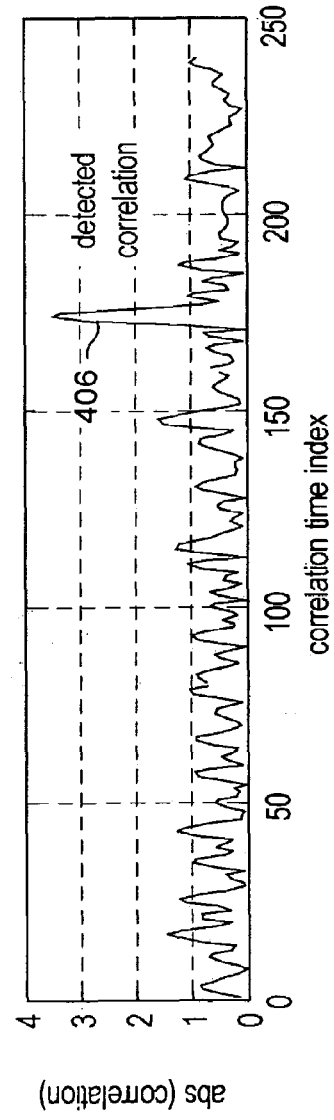
FIG. 4A
FIG. 4B
FIG. 4C

SYSTEM AND METHOD FOR GENERATING TRIGGERS BASED ON PREDETERMINED TRIGGER WAVEFORM AND A MEASUREMENT SIGNAL

BACKGROUND

One widely used available test system is an oscilloscope. Generally an oscilloscope is an instrument which captures a waveform for a period of time and can then generate an image corresponding to the time domain waveform samples on a display of the oscilloscope. Additionally, the information captured by the oscilloscope can be stored on a storage device, and further processed to provide a wide range of measurement information. One of the challenges in using an oscilloscope is determining when to start, or trigger, the capturing or displaying of data. Frequently, the signal which is being measured using an oscilloscope is a periodic, or sporadic, type of signal where the voltage of interest occurs at different points in time, and for relatively short periods of time. Thus, one of the challenges in using an oscilloscope is determining when to trigger the capture or display of measurement data, because for relatively long stretches of time there can frequently be no information of interest.

In the past, some oscilloscopes were triggered based on the magnitude and the slope of an incoming measurement signal waveform. With the advent of higher speed oscilloscopes based on an array of moderate speed analog to digital converters (ADC) running in parallel, some of the previously used trigger techniques have been found to have significant limitations.

Some prior high speed oscilloscopes have used dedicated analog circuitry to generate trigger signals. The analog signal may come from the input signal directly, or in some cases the analog trigger can actually be reconstructed from a digital data stream (or a subset of the data stream) coming from the ADC. Generally, many of the prior implementations have been found to have significant limitations, particularly at high sampling rates and for higher frequency measurement signals.

BRIEF DESCRIPTION OF THE DRAWINGS

FIGS. 4A–4C show a series of plots with signals corresponding to a predetermined trigger waveform, an input measurement signal, and a correlation between the predetermined trigger waveform, and the input measurement signal, according to an embodiment of a method of the invention.

DETAILED DESCRIPTION

An embodiment of the invention herein provides for using the digital output of an ADC, or a parallel array of ADCs, to determine a trigger point. For example, in one embodiment of the invention the trigger generation is done digitally using parallel digital signal processing on a parallel data stream of digital samples coming from a bank of moderate speed ADCs, which together form a high speed ADC. This operation can allow the trigger circuitry to have the same fidelity and signal bandwidth as the high speed ADC.

Figure 1:
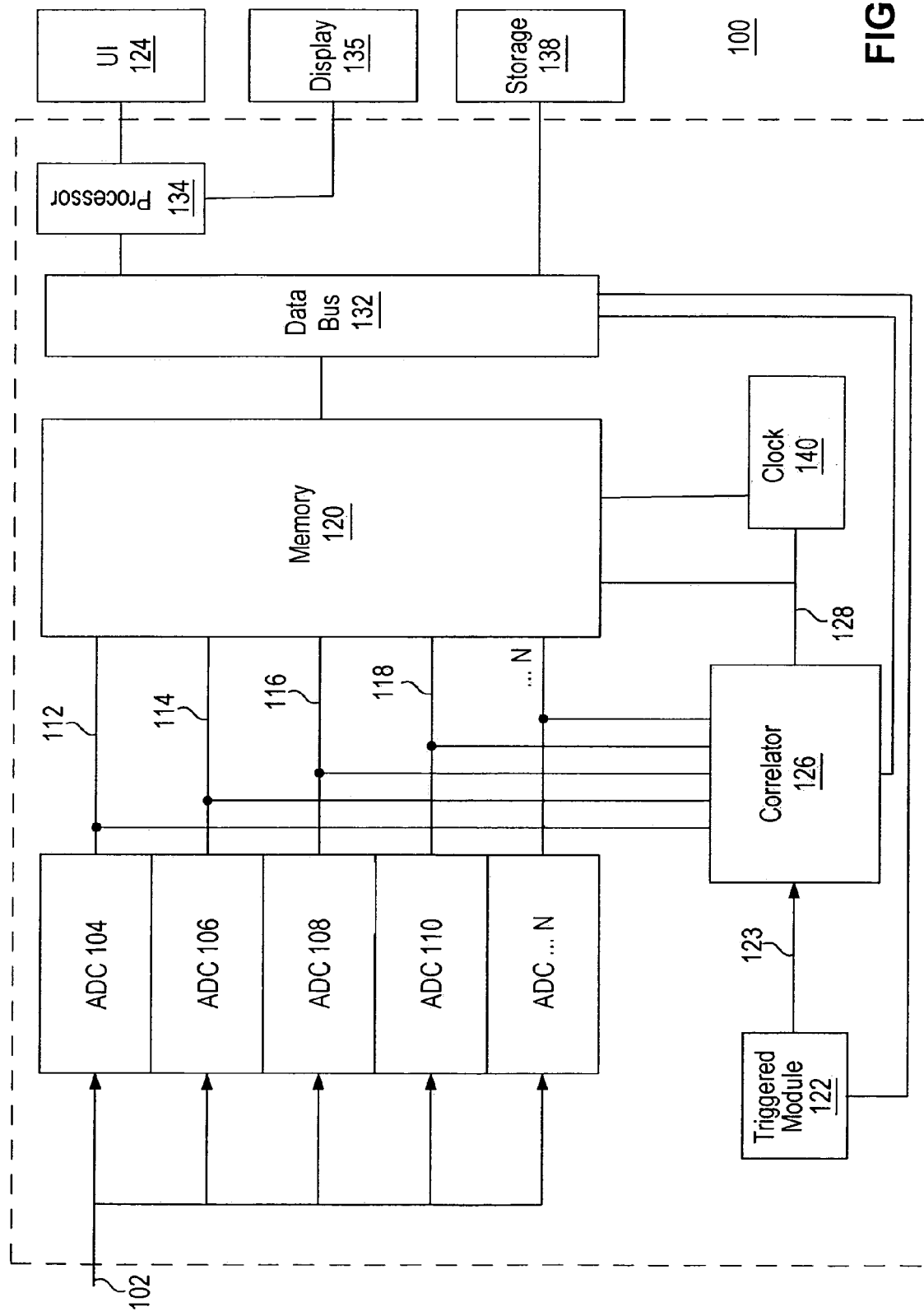
FIG. 1 is a block diagram showing an embodiment of a system of the invention.

FIG. 1 shows an embodiment of a system 100 of the invention. The system 100 provides for an input of a measurement signal 102, which will typically be an analog signal. The input measurement signal 102 will be routed to an array of N parallel analog to digital converters (ADCs) 104, 106, 108, . . . N.

Each ADC is clocked with a slight time delay relative to the proceeding ADC so the incoming waveform is sampled in a parallel manner, such that each sample is slightly delayed in time relative to the sample from the upstream ADC. At each ADC clock cycle there are N consecutive waveform samples 112–118. A memory 120 is provided which receives the waveform samples 112–118. Additional registers (not shown) or memory could be provided to buffer additional samples to increase the number of consecutive samples used in each block of trigger calculations. In one embodiment, the memory 120 can serve as an interim memory while the correlator is processing the digital samples.

The system also provides a trigger waveform module 122. The trigger module provides the correlator 126 with the frequency domain representation of the desired trigger waveform. The trigger module can generate a wide range of different trigger waveforms 123. A user interface 124 can be provided with the system. The UI 124 and include a mouse controller and a keyboard through which a user can input different waveform parameters. The trigger waveform module 122 can also be preloaded with a number of different waveforms which a user can select from. Additionally, a range of different modes of operation can be provided where the system operates to automatically detect a suitable trigger waveform.

A trigger waveform output 123 and the N digital samples from the array of N parallel ADCs are input to a correlator module 126. Optionally the data from the parallel ADCs 104- . . . N can be buffered to provide the correlator 126 with a longer (more than N) waveform record. The correlator module operates to correlate the trigger waveform 123 with waveform samples. The correlation between the trigger waveform and the waveform samples then provides results which can be analyzed. The correlation can be performed in the time-domain but the frequency domain option takes advantage of the efficiency of the Fast Fourier Transform (FFT) and simplifies the complexity of the required operation. The correlator 126 can include an analyzer module which then determines a trigger point time for initiating the trigger, which corresponds to the capture of information from the samples 112-N. Thus, the trigger point time operates to identify selected samples of the N digital samples, where the selected samples include selected measurement data from the measurement signal.

Figure 2:
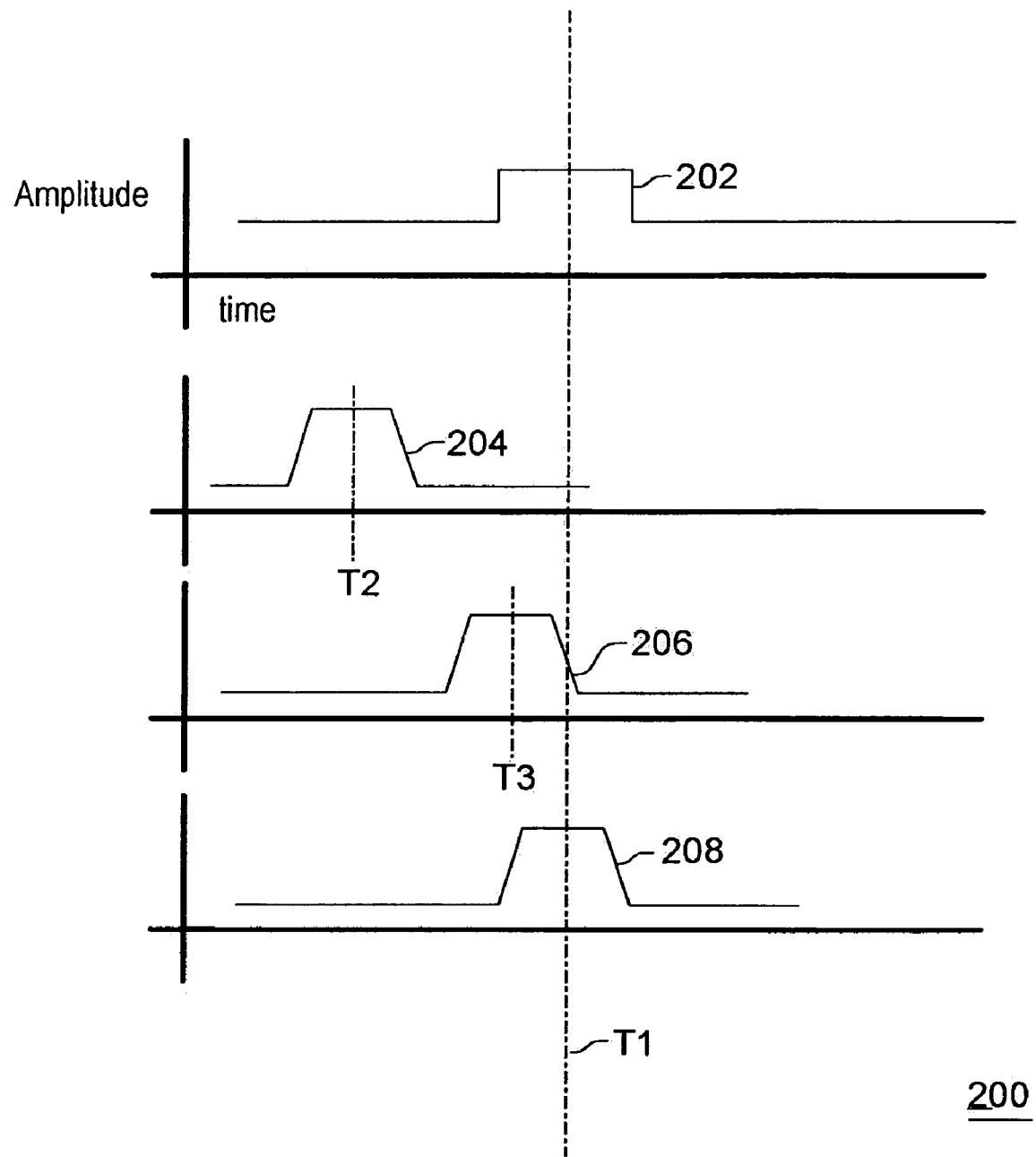
FIG. 2 shows a series of plots with a number of signals which illustrate a correlation operation of an embodiment of the invention.

FIG. 2 shows a number of plots 200 with different signals 202–208. Signal 202 illustrates a trigger pulse in a test system such as an oscilloscope. The trigger point in time for the trigger pulse is centered at a time T1. The signal 204 illustrates a measurement signal input to the test system.

This signal 204 would correspond to N number of samples with each sample slightly offset in time from an adjacent sample. Signals 206–208 illustrate the input signal as time advances. At a time where the input signal 204 is centered at time T2 there is no correlation between the trigger pulse 202 and the measurement signal 204. At a time where the input signal 206 is centered at a time T3 there is some correlation between the trigger pulse 202 and the measurement signal 206. At a time where the input signal 208 is centered at T1 there is a very high correlation between the trigger pulse 202 and the measurement signal 208. In one embodiment the correlator would operate to determine the trigger time point which provides the highest degree of correlation between the measurement signal and the trigger waveform. Once the trigger time point is determined the correlator module will generate a trigger signal 128 to the memory module 120 which provides a signal indicating a trigger point time that identifies which digital samples should then be selected for transmission to other elements of the system, where the information in the selected digital samples can be captured.

For example, in the system 100 the selected samples 130 would be transmitted from the memory 120 to a data bus 132. The data bus can then make the data available to a processor 134. The processor 134 can then provide for generating an image on a display 136, where the image corresponds to the measurement data from the data samples which were generated based on the measurement signal received at a time corresponding to the trigger point time. The processor 134 can further provide for printing out the measurement data, and/or for storing the measurement data in a data storage system 138. Further, the processor can receive user input information from a user input device 124 to change the display, or storage of the information. This user input information could also include information identifying or selecting a particular predetermined waveform, as discussed above.

In general the operation of determining the correlation between the trigger waveform and the input measurement signal can be achieved by processing the trigger waveform and the input signal in either the time domain on in the frequency domain. For discussion purposes one can assume that the input measurement signal is given as a finite length of input samples Q(nT)=data (nT+offset), n=0–L; and that the predetermined trigger waveform is a finite length sampled trigger pattern given as P(nT), n=0–M. A convolution search for the trigger waveform in the collection of digital samples of the input measurement signal can be performed, where the correlation of the trigger waveform to the input signals can be described by the equation:

$$\text{correlation}(nT) = P(nT) * Q(nT) = \sum_{m=-\infty}^{m=+\infty} P(nT)Q(nT+m)$$

The above described correlation operation can performed in either the time domain or in the frequency domain. Generally speaking it will be more efficient to perform the above calculations in the frequency domain. Processing using frequency domain information, where a fast Fourier transformation (FFT) from the time domain to the frequency domain is used, becomes increasingly beneficial from a processing stand point as the length of input measurement signal increases.

In the system 100 the correlator 126 can be a parallel correlator which calculates the correlation of the input waveform to the predetermined trigger waveform in parallel for each of the N different samples. The result of the this correlation then identifies a trigger point time 128 which operates to time stamp the digital signals in the memory 120 so that these digital signals corresponding to the trigger point time stamp can be captured from the memory 120, as the memory 120 will generally operate as a temporary storage buffer for a limited amount of data.

Additionally, where multiple trigger points have been identified, and there is an identifiable periodic function with the occurrence of these trigger points the trigger point signal 128 can be used to synchronize a clock 140, which can then be used to provide a plurality of trigger points in time corresponding to the identified period. In one such embodiment past correlation based triggers are used to train an estimator which will allow the prediction of future periodic triggers.

Figure 3:
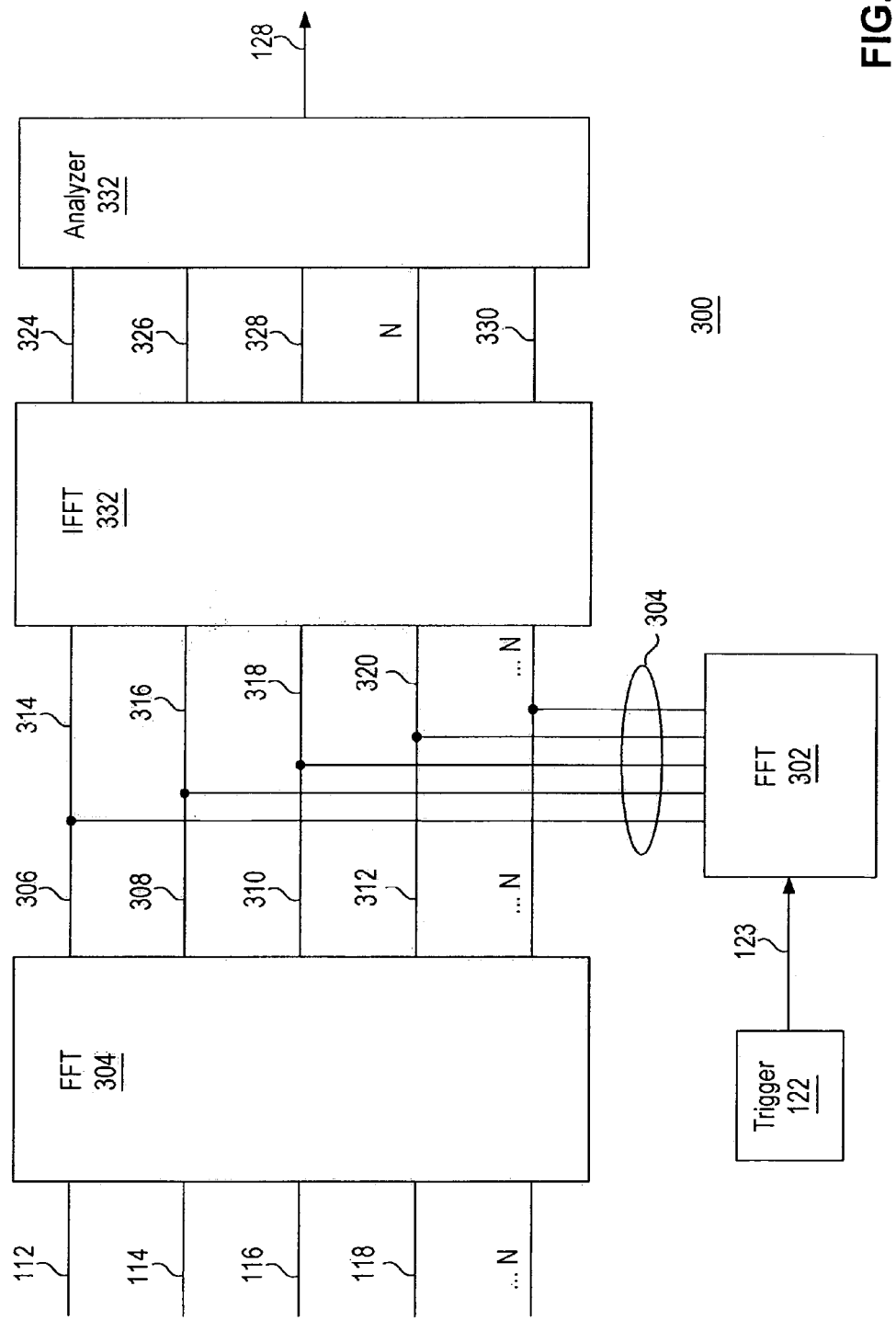
FIG. 3 is a block diagram showing an embodiment of a correlator module of system according to an embodiment of the present invention.

FIG. 3 shows elements of an embodiment of a correlator 300 of an embodiment of the invention herein, and which can be utilized to provide the correlation function of the correlator module 126 shown in FIG. 1. The trigger waveform module 122 can provide the trigger waveform signal 123. This trigger waveform signal can then be input to a FFT module 302 which operates to provide a FFT of the trigger waveform, whereby the frequency components of the trigger waveform are provided. The N digital samples output by the ADCs 104 . . . N are input to a measurement signal FFT module 304. A parallel array of input signal frequency domain components 306 . . . N are then output by the FFT module 304. The frequency components 306 . . . N are then correlated with the FFT signal 304 from the FFT module 302. An array of correlated signals 314 . . . N are then input to an inverse fast Fourier transform (IFFT) module 322. The operation of the IFFT module 322 then operates to convert the frequency domain signals to time domain signals 324–330. These signals are then input to an analyzer module 332 which operates to determine when a trigger point time which has the sufficiently strong correlation with the input measurement signal, and this trigger signal is output as a trigger point time signal 128 as described above in connection with FIG. 1.

Embodiments of the invention herein provide a number of significant benefits. One aspect of the invention is that it can be implemented in a topology which takes advantage of the parallel ADC structure which is utilized in many modern high speed oscilloscopes. The topology of the system described above allows for the correlation to be calculated at the sampling rate of the individual ADCs as opposed to the combined sampling rate where performing these calculations at the combined sampling rate could be very difficult.

It should be recognized that the correlator module could be implemented in a number of different ways. One option would be to perform the correlation operation on the time domain. N parallel banks of correlators could be provided to cover all the possible phases of the input versus the predetermined trigger waveform. Another possibility is the FFT based approach, as discussed above, where the N input data samples are converted to the frequency domain, where the result is multiplied with the FFT of the trigger waveform and finally converted back to the time domain with an inverse fast Fourier transformation (IFFT). This later approach will be significantly more efficient for large values of N.

Another benefit of an embodiment herein, is that the trigger point time is generated based on an analysis of N different samples, this use of multiple different samples provides for a processing gain which may allow for better performance than conventional analog trigger circuitry, especially in the present of significant measurement noise.

In some applications the operations of the oscilloscope will require a correlation using a trigger waveform and an inverse polarity of the trigger waveform. This type of application could be handled by performing a correlation between the absolute value of the input measurement signal and the trigger waveform. One example of this type of application is measuring a signal from an impulse radio where a digital "1" may be represented by a positive impulse while a digital "0" may be represented by an impulse of the opposite polarity. Another application would be detecting signals from an impulse radar system. Both the impulse radios and impulse radars have signals with very short (often less than a nanosecond) durations. To detect these signals one needs to use a very high sample rate but the duty factor is typically very low. If one were to process and store the full data stream in memory to find the desired impulses, the amount of data gathered which would be stored could be massive, and most of the information would not be of interest. An embodiment of the system and method herein provide for realtime correlation of the digital samples with the trigger waveform which allows for identification of the signal in measurement data contained in the digital samples derived from the measurement signal. In essence, in parallel with the information being stored in an interim memory 120, the correlator would operate to identify trigger points, and these trigger points can be used to capture selected measurement data from the memory 120.

In one embodiment of a system and method of the invention when the correlation operation provides a trigger point time, the measured data corresponding to that point in time is captured, and an accurate time stamp can be added to the data so the exact time of reception can be determined when the data is processed. In some embodiments this operation can allow for calculating error vector magnitude (EVM) values for received signals even though no external trigger was supplied to the receiver.

For systems where the incoming measurement signal includes a periodic signal of interest, an internal clock can in some implementations use the result of the correlator to synchronize the internal clock. Once the clock is successfully synchronized, the correlator could be disabled. Captured data could then be used to keep the timer synchronized. Where the memory 120 is large enough, it can be used to provide for pipelining such that it stores large numbers of digital samples surrounding the trigger point time, and it could also be used to compensate for delays related to the calculation of the correlation.

Another embodiment of a system and method of the present invention provides for the detection of a specific sequence of input samples as opposed to just detecting a rising edge of a pulse which exceeds a particular threshold. The longer the specific sequence the better the correlator can perform in terms of detecting the desired sequence from noise or disturbance signals. Once the correlator has detected the known sequence, the entire transmission could be stored for detailed evaluation. By using a circular buffer, signals before and after the correlation trigger can be recorded.

The embodiment of the system 100 shown in FIG. 1 shows a single trigger waveform module 122, and a single correlator module. However, an embodiment of the system herein could provide for using multiple trigger waveform modules and multiple correlator modules in parallel, to correlate the same input data samples using different trigger waveforms. If a FFT based correlator is used, each parallel correlator could share the FFT of the input data stream. Each correlator could then apply the additional multiplication and inverse FFT operations for each additional trigger pattern (which could be computed ahead of time).

FIGS. 4A–4C show a series of plots which illustrate a simulation of detecting an impulse in a noise measurement data stream. FIG. 4A shows a predetermined trigger waveform 402, which in this case is a truncated sync pulse. FIG. 4B shows an input measurement signal 404, where the trigger is embedded in random noise with 0.6 RMS level. FIG. 4C shows a detected correlation signal 406 as output by a correlator module, where the correlation module determines a correlation between the trigger pattern waveform and the noisy input measurement signal.

The method of operation illustrated in FIGS. 4A–4C shows a characteristic of an embodiment of the invention which provides an advantage over a simple level detection triggering approach. If a simple threshold level detection method is used there could be many false triggers since the peak noise level in the signal 404 could often exceed the peak value of the desired impulse. The result of the correlation shown as signal 406 clearly distinguishes the pattern of the trigger from that of the noise. This simulation uses a 21 sample truncated sync pulse as a trigger pattern. Longer trigger patterns will generally result in higher processing gain and improve the ability to detect signals buried in noise.

Figure 5:
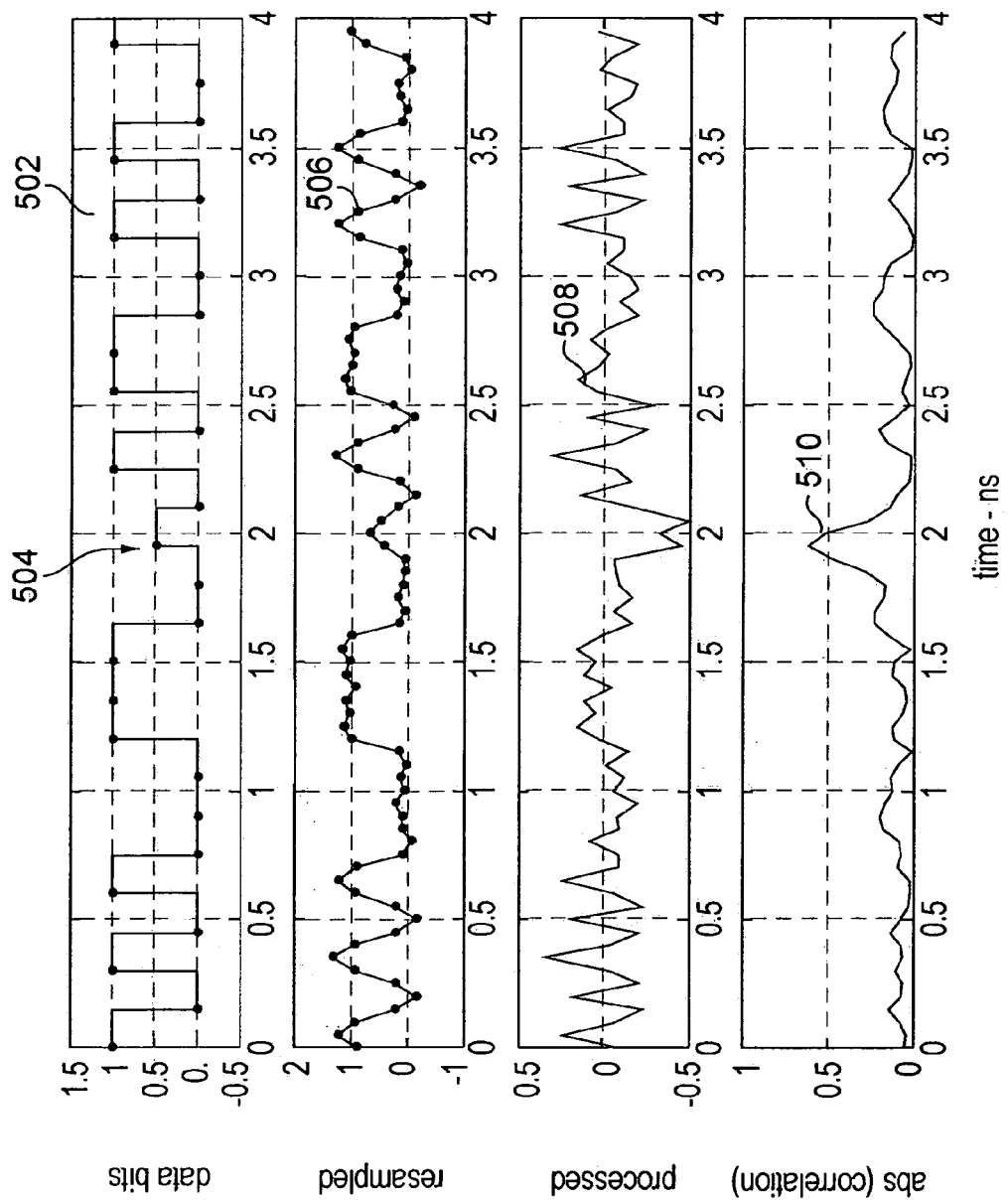
FIG. 5 shows a series of plots with numerous different signals corresponding to different processing stages according to an embodiment of a method of the invention.

FIG. 5 shows a series of graphs which illustrate a method of the invention herein for the detection of runt pulses in a digital data stream, where a runt pulse is shown in the data bit stream signal 502 as pulse 504. The detection of runt pulses in data streams is an example of an application for which high speed oscilloscopes are often used, and this is particularly the case due to the prevalence of increasingly fast serial data links. One goal in such applications is to detect pulses that are above the value allowed for a logical 0 and below that level required for a logical 1.

The data bit stream signal 502 of the example shown in FIG. 5 illustrates a random set of data bits clocking at 6.67 GHz. The sample pulse 504 which starts just prior to 2 ns is an invalid bit having undefined amplitude. The signal 506 shown in the second plot is a filtered and upsampled version of the original bit stream intended to represent what a 20 Gs/s oscilloscope would actually record. The signal 508 shown in third plot shows the processed data stream where the mean is removed from the signal 506, and the absolute value is taken, and then the original mean is removed again. Ideally this plot would be a constant zero value. The final plot shows a signal 510 which is the result of the correlation between the processed data stream, which is the signal 508, and the signal of a ½ scale runt pulse, where the ½ scale runt pulse is used as a predetermined trigger waveform in the correlator module.

The preprocessing which generates the signal 508 can be performed in a parallel manner by a preprocessing module (not shown) before a FFT module which operates to transform the digital data samples generated by the ADCs, the processed signal is then transformed by the FFT module and the correlation is then performed. The system 100 shown in FIG. 1, for example, could include a preprocessing module (not shown) which would preprocess the digital samples prior to inputting them into correlator module 126. By providing for some amount of preprocessing the correlation operation can be used to provide for searching for specific types of signals in the input measurement signal.

Figure 6:
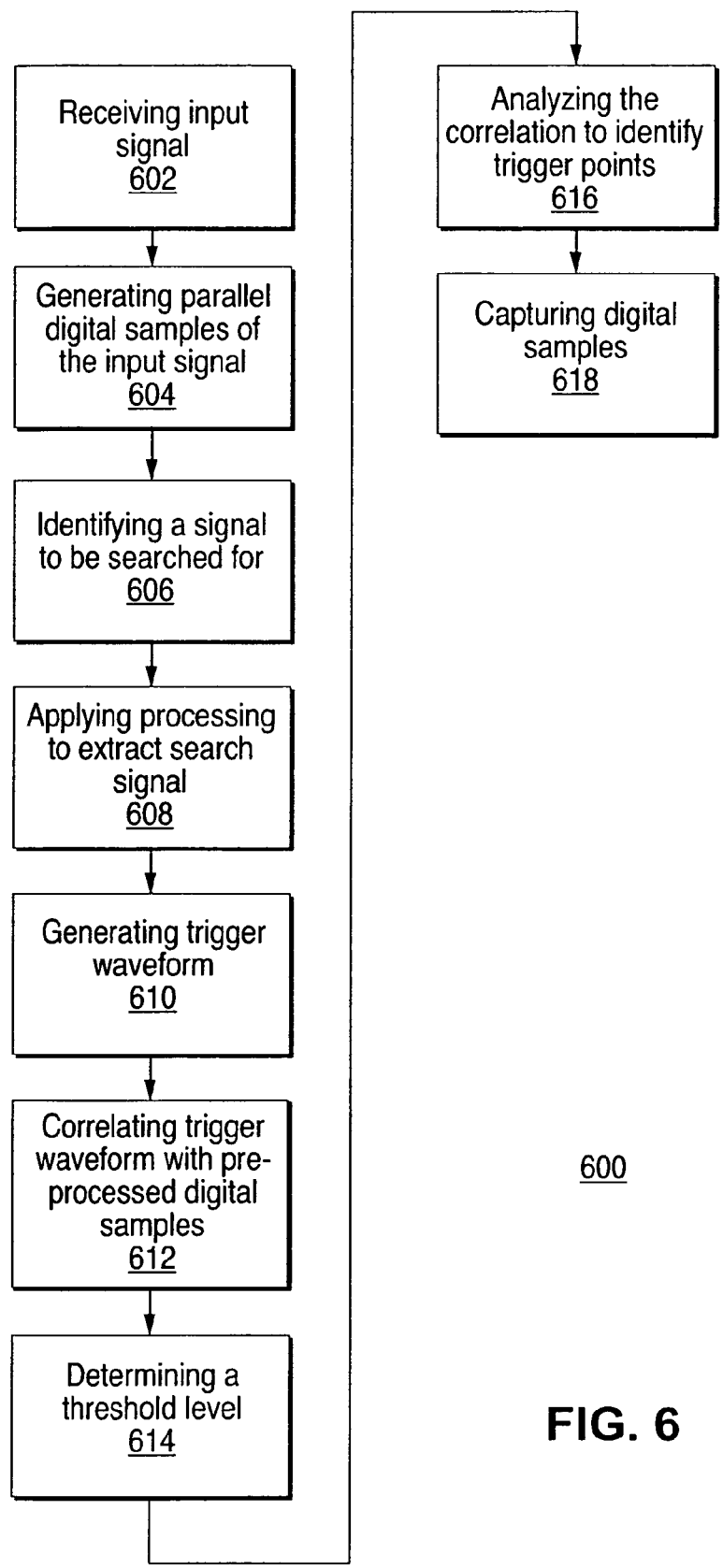
FIG. 6 shows a flow diagram illustrating a method to an embodiment of the invention herein.

The above discussed examples show cases where parallel signal processing is used to generate triggers for high-speed oscilloscopes that rely on a bank of parallel moderate speed analog to digital converters to achieve the high sample rates. The examples illustrate how a FFT based correlator can be used, but the concept should not be limited to using FFT based processing. Indeed, one aspect of the invention herein is to advantageously utilize the multiple signal samples available from the ADCs and process these signals in parallel at the sample rate of the individual (moderate speed) ADC clock. If longer vectors are desired, the parallel ADC outputs can be registered, or stored, to hold as many data samples as required for the triggering task FIG. 6 is a flow chart illustrating aspects of an embodiment of a method 600 of the present invention. One aspect of the method 600 is receiving 602 an input measurement signal. The method further includes providing a parallel array of ADC, which generates 604 digital samples of the measurement signal in parallel. A search signal which is to be searched for in the input measurement signal is then identified 606. A signal processing operation is applied 608 to modify the digital samples to provide preprocessed samples, such that when the search signal is in the measurement signal it will be somewhat isolated in the digital samples. A trigger waveform which corresponds to the search signal is generated 610. The predetermined trigger waveform is then correlated 612 with the preprocessed digital samples of the input measurement signal. As discussed above the correlation operation could be done in either the time domain or the frequency domain. This correlation of the digital samples with the predetermined trigger waveform then operates to provide a correlation output. A threshold level is determined 614. An analysis is then performed 616 to identify trigger points in time where the correlation reaches the threshold level, and the identification of trigger points provides an indication that predetermined trigger waveform has been located in the measurement signal. The digital samples of the measurement signal which correspond to the trigger points are then captured 618. This capturing can include for example, storing the digital samples which correspond to the trigger points in a storage device and/or generating an image on a display of the digital samples which correspond to the trigger points. The method 600 can be implemented as a continuous and on-going process where an input measurement signal is continuously being input the system, and the method 600 is continuously being applied to the input signal so that information of interest in the signal is continuously being captured.

Figure 7:
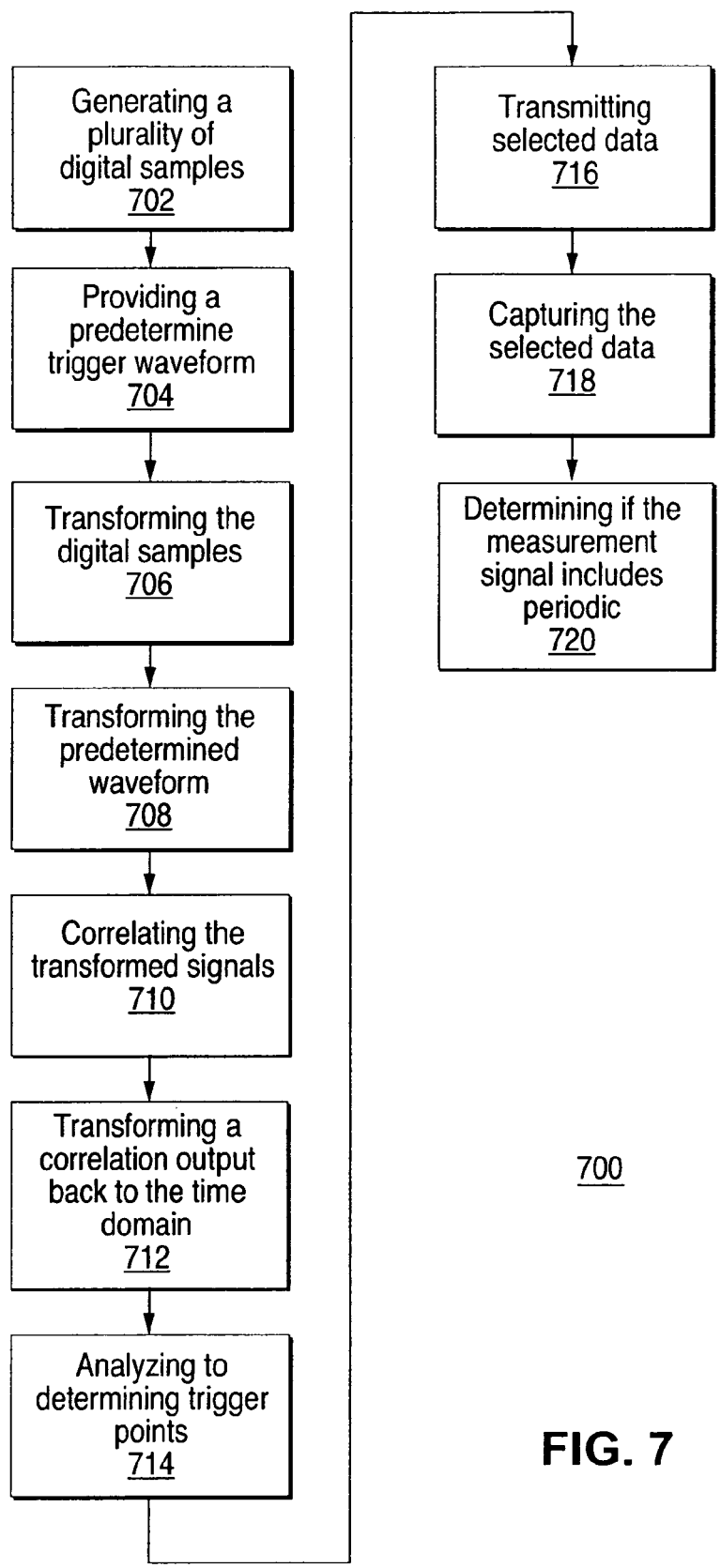
FIG. 7 shows a flow diagram illustrating a method an alternative embodiment of the invention herein.

FIG. 7 provides a flow chart 700 illustrating an alternative method of the invention herein. The method includes generating 702 a plurality of digital samples from a measurement signal. This generation of the plurality of digital samples can be achieved by providing a parallel array of ADCs. The digital samples can be generated as a parallel stream of digital samples. Additionally a predetermined trigger waveform is provided 704. This predetermined trigger waveform can be identified and stored prior to generating the digital samples. The digital samples are transformed 706 from the time domain to the frequency domain using a FFT. Also, though not shown the digital samples can be preprocessed as described above prior to the FFT operation. This FFT process can be provided to make the method of correlation more efficient, however, as noted above the correlation could also be done without this transformation.

The predetermined trigger waveform can also be transformed 708 using a FFT process. This processing of the predetermined trigger waveform could be done realtime, or it could also be done in advance of the generation and digital samples, and the predetermined trigger waveform information can be stored in a memory of the system, and this information could then be used during the processing of the method herein.

The FFT of predetermined trigger waveform is then correlated 710 with the FFT of the digital samples. The output of this correlation is then transformed 712 using an IFFT back to the time domain. The output of the IFFT is then analyzed 714 to identify trigger points in time where there is a strong correlation between the digital samples and the predetermined trigger waveform. The identification of a strong correlation could include identifying a point in time which has the highest correlation value for a given set of digital samples obtained during a given time period, or it could include identifying points in time where the correlation result exceed some given threshold value. The identified trigger points correspond to points in time where the digital samples corresponding to that point in time are identified as selected digital samples, which include selected measurement data. This identification could be done by providing a time stamp to identify a time when the selected digital samples were received. This selected data is then transmitted 716 from an interim memory of the oscilloscope to other elements of the measurement system which capture 718 the selected data. This capture of the selected data can include providing the selected data to a processor of the system which generates an image which can be shown on a display of the system; and the selected data could also be stored in a storage element such as a solid state memory, or a hard disk drive of the system, and used for further analysis; the selected data could also be printed out for future reference.

Where multiple trigger points are identified the method can further provide for determining 720 if the measurement signal includes a periodic signal. Where it has been determined that there is a periodic signal in the measurement signal, then an internal clock in the oscilloscope could be set to provide for a periodic trigger point based on the period of the detected periodic signal, and the measurement signal could be used to maintain the synchronization, thereafter.

The method 700 can be implemented as a continuous and on-going process where the input measurement signal is continuously being input the system, and the method 700 is continuously being applied to the input signal so that information of interest in the signal is continuously being captured.

As discussed above, the invention herein can be implemented in a range of different systems and methods. One aspect an embodiment of the invention provides for correlation between the outputs of a high-speed ADC, which is realized using many parallel lower speed ADCs, and a user supplied trigger waveform to generate a trigger point for storing a finite time record of data surrounding the interval where the correlation exceeded a predetermined threshold. Adding an accurate time stamp to the data when stored following the detection of a trigger point can allow for a demodulation of signal where time shifts are applied to encode a carrier with data, for example in an impulse radio. There are of course a wide range of alternative embodiments and applications for the invention herein.

Thus, although only specific embodiments of the present invention are shown and described herein, the invention is not to be limited by these embodiments. Rather, the scope of the invention is to be defined by these descriptions taken together with the attached claims and their equivalents.

What is claimed is:

1. In a measurement system a method for capturing a waveform contained in an input signal, the method comprising:

generating a plurality of digital samples from the input signal;

providing a predetermined trigger waveform having a frequency spectrum that substantially matches that of the waveform contained in the input signal; and correlating the predetermined trigger waveform with the plurality of digital samples to identify a trigger point time when the input signal contains the waveform.

2. The method of claim 1 further comprising:

providing a plurality of parallel analog to digital converters which receive the input signal and generate the plurality of digital samples.

3. The method of claim 1 further comprising:

performing a fast Fourier transform on the plurality of digital samples;

performing a fast Fourier transform on the predetermined trigger waveform; and wherein the correlating of the predetermined trigger waveform with the digital samples includes correlating the Fourier transform of the plurality of digital samples with the Fourier transform of the predetermined trigger waveform.

4. The method of claim 1 wherein generating the plurality of digital signals includes generating an absolute value signal which corresponds to the waveform contained in the input signal.

5. The method of claim 1 further including:

using the trigger point time to generate a plurality of trigger point times; and using the plurality of trigger point times to capture a periodic waveform contained in the input signal.

6. The method of claim 1 further wherein the input signal is a serial data stream, and wherein generating the plurality of digital samples includes preprocessing the plurality of digital samples to isolate a runt pulse.

7. The method of claim 6, wherein correlating the predetermined trigger waveform with the plurality of digital samples operates to provide a trigger point time when the runt pulse occurs in the input signal.

8. A measurement system which uses digital samples of an input signal to generate a trigger point, the system comprising:

an analog to digital converter which operates to generate a plurality of digital samples from the input signal, wherein the digital samples include a waveform of interest;

a predetermined trigger waveform generator, which generates a predetermined trigger waveform that has a correlation to the waveform of interest;

a correlator which correlates the predetermined trigger waveform with the plurality of digital samples; and an analyzer which operates to analyze an output of the correlator to identify a trigger point which is used for identifying the waveform of interest in the plurality of digital samples.

9. The system of claim 8 wherein the analog to digital converter comprises a plurality of analog to digital converters which are configured in parallel, to generate the plurality of digital samples.

10. The system of claim 8 further including:

a fast Fourier transformer module which operates to transform the plurality of digital signals to the frequency domain;

wherein the correlator operates to correlate the predetermined trigger waveform with the digital signals in the frequency domain.

11. The system of claim 8 further including:

an internal clock which operates to synchronize multiple trigger points with a periodic waveform contained in the input signal.

12. The system of claim 8 further including:

a first fast Fourier transformer module which operates to transform the plurality of digital signals to the frequency domain;

a second fast Fourier transformer module which operates to transform the predetermined trigger waveform to the frequency domain; and wherein the correlator operates to correlate the predetermine trigger waveform with the digital signals in the frequency domain.

13. The system of claim 8 wherein the analog to digital converter comprises a plurality of analog to digital converters configured in parallel, and wherein the plurality of analog to digital converters operate to output the plurality of digital samples in parallel, and wherein the system further includes:

an interim memory which operates to store the plurality of digital samples while the correlator is operating to correlate the predetermined trigger waveform with the plurality of digital samples; and wherein the analyzer operates to use the identified trigger point to identify a first set of the digital samples in the interim memory which corresponds to the waveform of interest.

14. The system of claim 8 further including:

a preprocessing module which operates to process the plurality of digital samples prior to inputting the digital samples into the correlator, and wherein the preprocessing module operates to generate absolute values corresponding to the waveform of interest input.

15. The system of claim 8 further including:

a preprocessing module which operates to process the plurality of digital samples prior to inputting the digital samples into the correlator, and wherein the preprocessing module operates to isolate the waveform of interest.

16. The system of claim 8 wherein the waveform of interest corresponds to a runt pulse contained in the input signal and the predetermined trigger waveform has a correlation to the runt pulse.

17. The system of claim 8 wherein the waveform of interest corresponds to an impulse signal contained in the input signal and the predetermined trigger waveform has a correlation to the impulse signal.

* * * * *

UNITED STATES PATENT AND TRADEMARK OFFICE
CERTIFICATE OF CORRECTION

| | | |
|---|---|---|
| PATENT NO. | : 7,225,093 B1 | Page 1 of 1 |
| APPLICATION NO. | : 11/285706 | |
| DATED | : May 29, 2007 | |
| INVENTOR(S) | : Corredoura | |

It is certified that error appears in the above-identified patent and that said Letters Patent is hereby corrected as shown below:

In column 10, line 43 (Approx.), in Claim 14, delete "input." and insert -- . --, therefor.

Signed and Sealed this

Twenty-first Day of August, 2007

JON W. DUDAS
*Director of the United States Patent and Trademark Office*